(12) United States Patent
Simon et al.

(10) Patent No.: US 7,489,594 B2
(45) Date of Patent: Feb. 10, 2009

(54) BLISTER PACK SYSTEM

(76) Inventors: Udo Simon, Virchowstrasse 16, Nuernberg (DE) 90409; Ernst-Rudolf Radtke, Gablonzer Strasse 6, Lauf a. d. Peg (DE) 91207

( * ) Notice: Subject to any disclaimer, the term of this patent is extended or adjusted under 35 U.S.C. 154(b) by 591 days.

(21) Appl. No.: 10/503,594

(22) PCT Filed: Jan. 23, 2003

(86) PCT No.: PCT/DE03/00179
§ 371 (c)(1), (2), (4) Date: Apr. 7, 2005

(87) PCT Pub. No.: WO03/068137
PCT Pub. Date: Aug. 21, 2003

(65) Prior Publication Data
US 2005/0226100 A1   Oct. 13, 2005

(30) Foreign Application Priority Data
Feb. 14, 2002   (DE) ................. 102 06 138

(51) Int. Cl.
G04B 47/00   (2006.01)
B65D 83/04   (2006.01)
(52) U.S. Cl. ............... 368/10; 206/531; 206/534
(58) Field of Classification Search ............ 368/10; 206/528, 531–534.2, 538; 221/2, 3, 5, 25
See application file for complete search history.

(56) References Cited

U.S. PATENT DOCUMENTS

| 4,125,190 | A |   | 11/1978 | Davie, Jr. et al. |
| 4,526,474 | A |   | 7/1985 | Simon |
| 4,617,557 | A | * | 10/1986 | Gordon ............ 340/309.7 |
| 4,660,991 | A |   | 4/1987 | Simon |
| 5,072,430 | A | * | 12/1991 | Eckernas et al. ........ 368/10 |
| 5,412,372 | A | * | 5/1995 | Parkhurst et al. ...... 340/568.1 |
| 6,574,166 | B2 | * | 6/2003 | Niemiec ............ 368/10 |

FOREIGN PATENT DOCUMENTS

| DE | 3518531 | 11/1986 |
| WO | 96/04881 | 2/1996 |

* cited by examiner

*Primary Examiner*—Vit W Miska
(74) *Attorney, Agent, or Firm*—Whyte Hirschboeck Dudek SC

(57) ABSTRACT

A blister pack system has a printed board, and the outside of the film of the blister pack has individual contact spots each assigned to a respective bag. Individual strip conductors run from each contact spot to a common conductor strip via the respective bag on the outside of the film. When a dragée is removed from a bag, the strip conductor assigned to the bag is interrupted. The printed board has perforations corresponding to the pattern of the bags and contact spots corresponding to the pattern of the contact spots of the blister pack. The contact spots of the board are directed towards the contact spots of the pack while the perforations of the board are directed towards the bags of the board. An edge area of the printed board has connecting contact spots each connected to a contact spot of the printed board via an individual strip conductor.

20 Claims, 8 Drawing Sheets

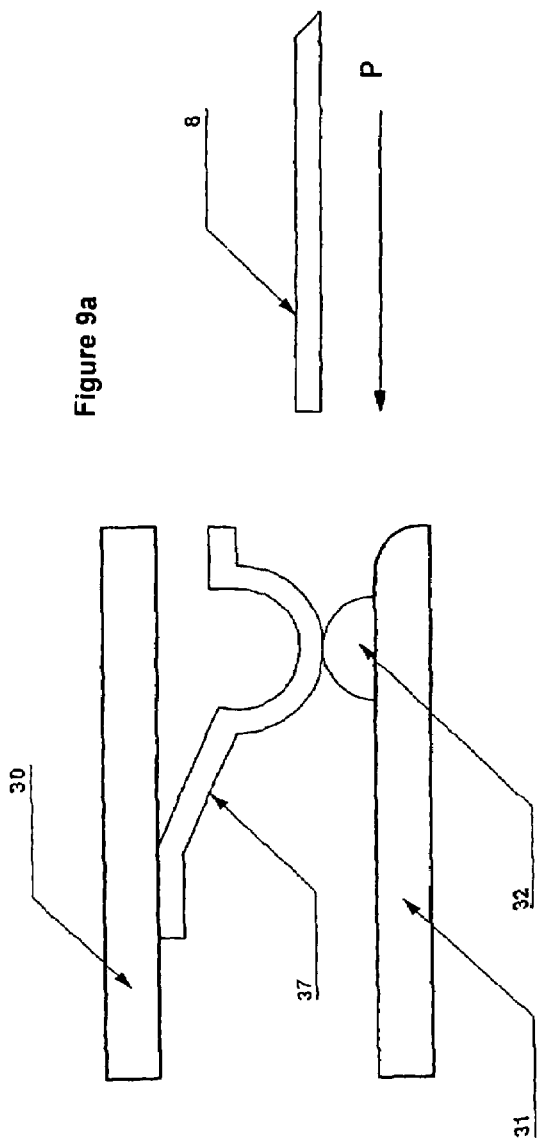
Figure 9a
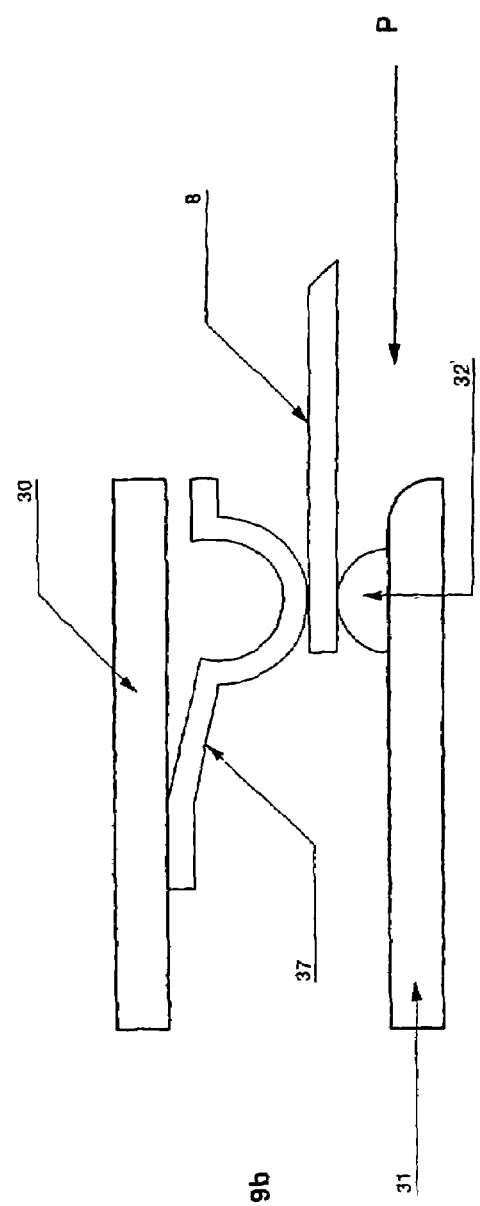
Figure 9b
Figure 9

BLISTER PACK SYSTEM

CROSS-REFERENCE TO RELATED APPLICATION

This is a nationalization of PCT/DE03/00179 filed Jan. 23, 2003 and published in German.

BACKGROUND OF THE INVENTION

1. Field of Invention

The present invention relates to a blister pack arrangement i.e., system, having a blister pack which has pockets sealed by a foil and which can be inserted into a receiving part of a holding device.

2. Description of the Prior Art

From U.S. Pat. No. 4,526,474, for example, a device follows which reminds a patient to take a pill. Therein a blister pack is set into a holding device which includes an electronics unit so that a patient can be reminded at the right time to take a pill from the blister pack, and along with this, the actual point in time of removing the pill can be recorded in the storage of the electronics unit and, in given cases, can be transmitted to a central data processing device. The pulses which display the removal of a pill are generated during the interruption of an electrical printed conductor.

For this, a printed conductor runs over each pill pocket of the blister pack, where one end of the printed conductor is always connected to a common printed conductor and the other end of the printed conductor is connected to an individual printed conductor. The printed conductors are disposed on the blister's foil sealing the individual pill pockets. From the blister, the common printed conductor and the individual printed conductors run over the counter-contacts of the holding device and their printed conductors to the electronics unit.

From U.S. Pat. No. 4,660,991 an additional device for holding a blister pack follows in which, instead of the foil having printed conductors and sealing the individual pill pockets, a material on which conductors are printed and which can be printed through (for example, special paper) is laid into the holding device which is energized by the counter-contacts of the holding device.

Also, this device has an electronics unit with a timer which, at the point in time of the removal of a first pill from the blister pack, picks up an electrical start pulse for the activation of the timer and which at predetermined times sends out a tone and/or optical signal (memory function).

The device includes a carrier frame which encircles the edge areas or corners of the blister pack at least partially and at its lower side is at least partially open so that the removal of a pill from a blister pack contained in the carrier frame is possible.

SUMMARY OF THE INVENTION

The objective of the present invention consists of structuring a blister pack arrangement so that a reliable recording by an electronics device of the removal of a pill is made possible and a so-called child safety is ensured.

This objective is realized by a connection of a blister pack arrangement with printed conductors and a printed circuit board with a child-safety covering foil with the features described herein.

A particular advantage of the present invention consists of the fact that the present blister pack arrangement is structured so that the removal of a pill by children is avoided.

This is achieved according to experience by a cover layer which is applied to the underside of the printed circuit board. Before the removal of a pill from the blister pack, a pull-off strip must be pulled off of the printed circuit board's cover layer which covers the through-print area of a pill on the printed circuit board. Only after pulling off of the strip can the pill be pressed out through pre-stamped areas. In so doing, the blister's printed conductor assigned to the pill is irreversibly separated, and the electronics recognizes the change in status of the blister.

An additional significant advantage of the present invention consists of the fact that on insertion of a blister pack arrangement into the holding device it is ensured that the printed circuit board automatically falls into the correct position for plug-in connection. An asymmetric arrangement of guide elements, preferably stampings, permits only a definite positioning of the blister pack arrangement in the holding device.

Incorrect recording of signals due to incorrect insertion of the blister pack arrangement into the holding device can be reliably avoided. This is achieved by the fact that the electronics unit is only activated when the blister pack arrangement is in the correct position to contact the plug. Thereby problems can be avoided which are to be traced back to processes in the insertion of the blister pack arrangement into the holding device. Such processes can, after the production of an individual electrical connection between the blister pack arrangement and the electronics unit, lead to interruptions of contact during relative movements between the blister pack arrangement and the holding device, which could simulate the removal of a pill.

A coding of the printed circuit board by stamping, perforations, slotting, barcodes, or electronic processes, etc., makes possible recognition by the electronics units of which drug is held in a blister. This coding is, for example, possible by the stamping of slots on the printed circuit board, which interrupts closed contacts of the electronics unit or by printing of conductive contact pads whose different arrangement can be assigned to a corresponding drug contained in the blister.

Advantageously, an economically reasonable production and the position-oriented guiding together of blister and printed circuit board are ensured. This is realized by the fact that, on the blister's covering foil bearing the printed conductors, one or more passer marks are printed which, for example, can be read by an optical control device through one or more windows of the printed circuit board.

The contact pads of the blister with printed conductors and the contact pads of the printed circuit board are connected long-term by means of a conductive adhesive. It is advantageous that through this long-term connection a secure contacting between the blister and the printed circuit board is ensured.

In order to optimize the bond between the blister and the printed circuit board, the edge areas of the blister are connected to a non-conductive adhesive. Thus, an essentially permanent connection between the blister and the printed circuit board is ensured.

BRIEF DESCRIPTION OF THE DRAWINGS

In the following, the invention and its developments are explained in more detail in connection with the figures. Shown are:

FIG. 4a shows the blister pack arrangement before insertion into the receiving part and FIG. 4b shows the blister pack arrangement after insertion into the receiving part, FIGS. 8 to 10: extensions of the invention.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 2:
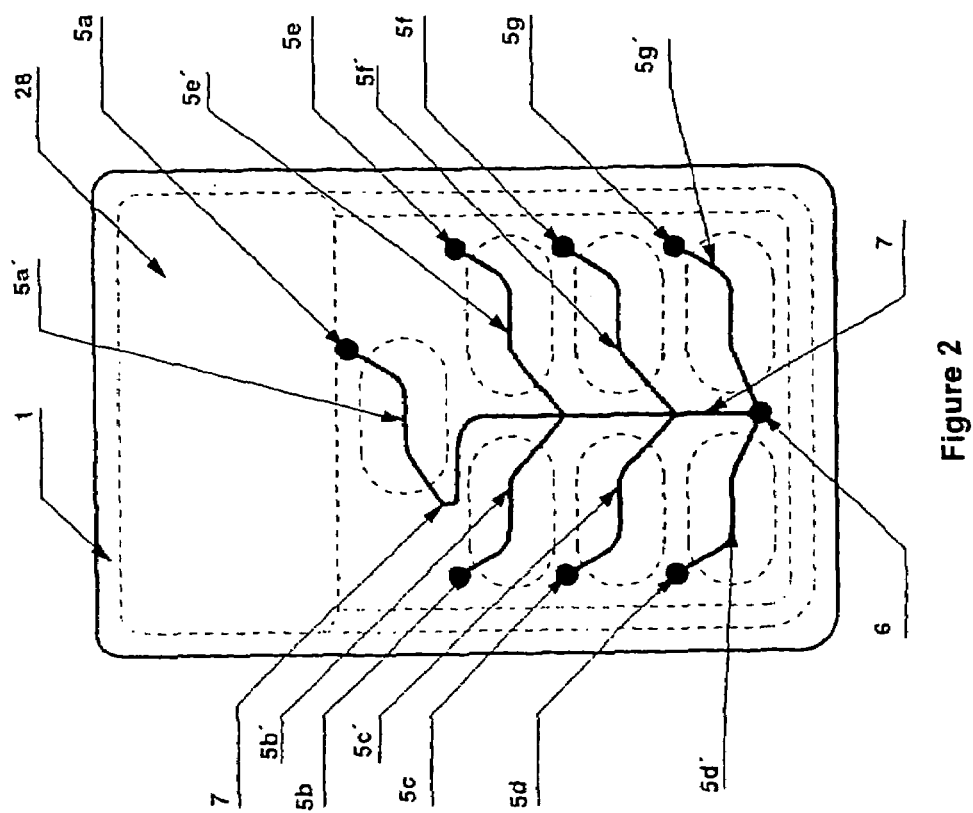
FIG. 2: the blister pack of FIG. 1 seen from below, where the special course of the common printed conductor and the individual printed conductors can be seen.
Figure 1:
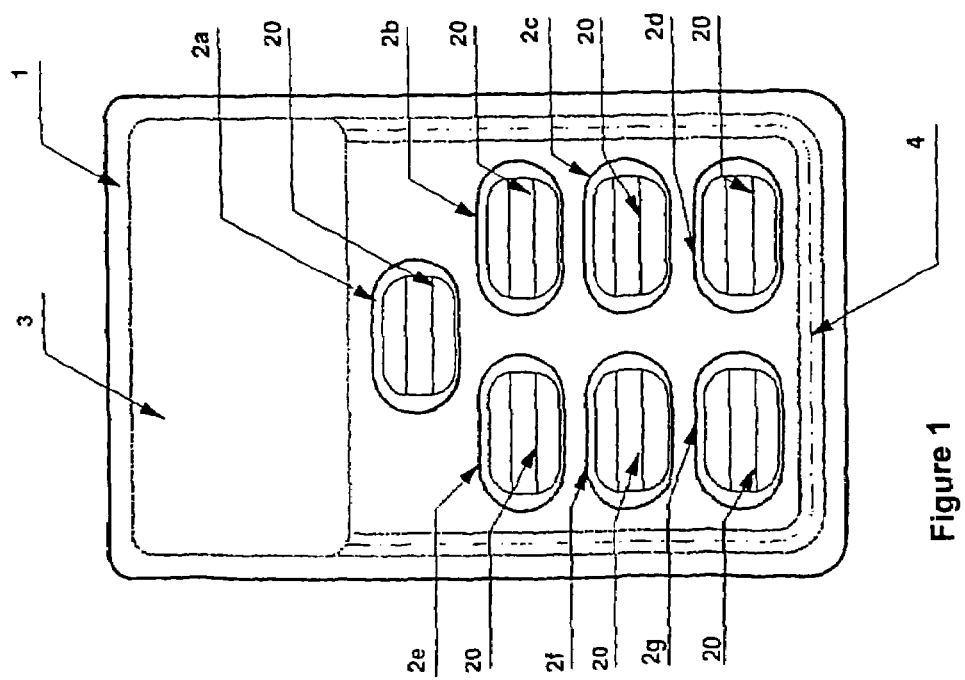
FIG. 1: a blister pack of the blister pack arrangement according to the invention seen from above.
Figure 4:
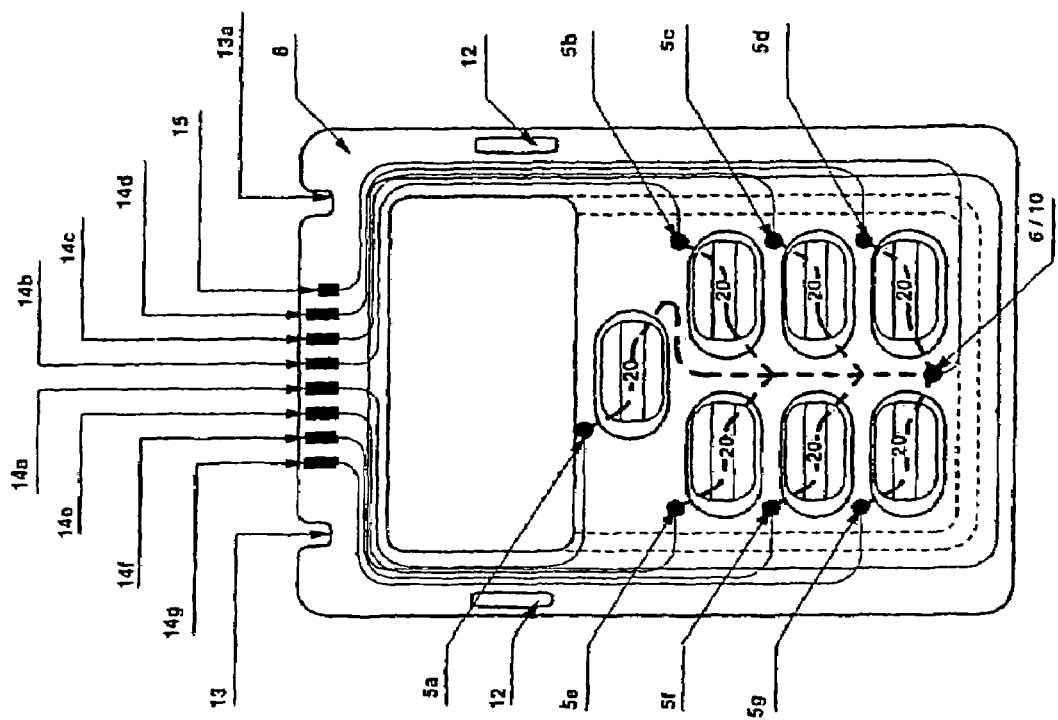
FIGS. 4, 4a, and 4b: the printed circuit board of FIG. 3 seen from above with opened blister pack. For explanation: different features of the invention, where
Figure 3:
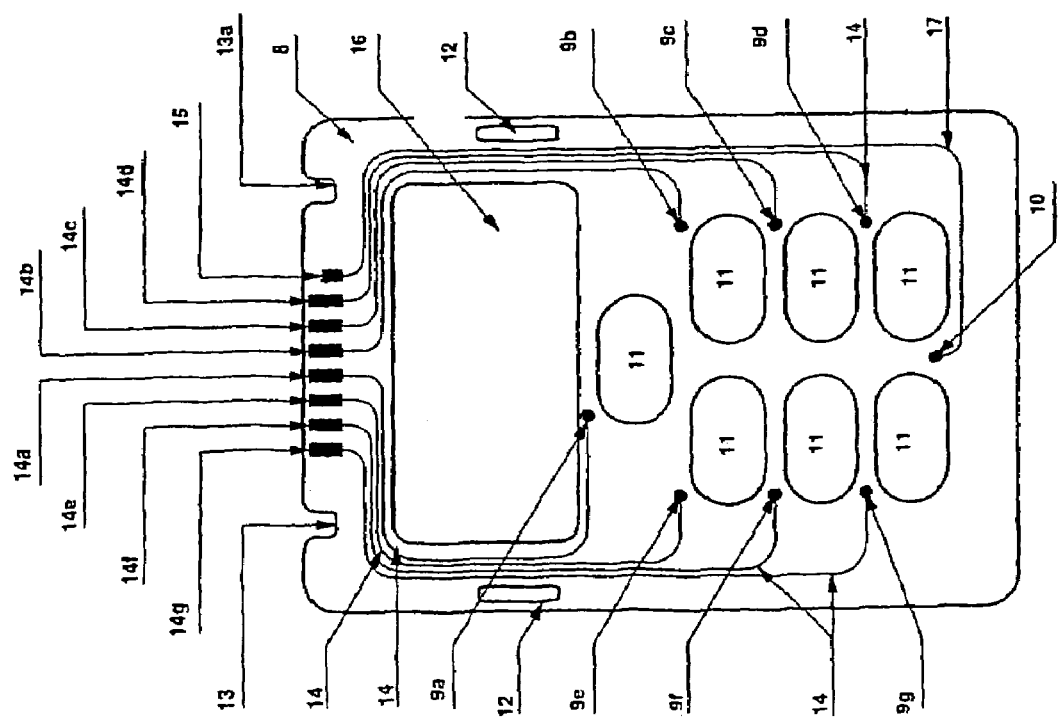
FIG. 3: a printed circuit board with printed conductors and openings for the removal of pills seen from above.

The present blister pack arrangement includes generally a blister pack which can be seen from FIGS. 1 and 2, said blister pack having several pill basins or pockets 2a to 2g which are customary per se and serve to receive medicaments, in particular tablets, pills, or dragees 20, and a printed circuit board 8 (FIGS. 3 and 4). Preferably, the blister pack 1 has, running in the longitudinal direction, two rows of pockets disposed adjacent to one another each with three pockets 2b, 2c, 2d or 2e, 2f, 2g, and an additional pocket 2a disposed in the center at one end of the opposing rows. For example, on the side of the central pocket 2a turned away from the two rows of pockets, a larger pocket-like compartment 3 can be disposed in which a folded pack insert slip or the like can be disposed. Other pocket arrangements are possible.

On the underside, a foil 28 sealing the pockets 2a to 2g and the compartment 3 is disposed according to FIG. 2. To reinforce the blister pack 1 a bead 4 running at least partially along the outer edge can be provided (cf. FIG. 1).

On the foil 28, different contact pads 5a to 5g are disposed on the outer side according to FIG. 2, of which one contact pad is assigned to each of the pockets 2a to 2g and disposed in its vicinity. From each contact pad 5a to 5g, an individual printed conductor 5a' to 5g' runs on the outer side of the foil 28 over the corresponding pockets 2a to 2g to a common printed conductor 7, which preferably runs in the center between the two rows of pockets and is connected to a common contact pad 6. Through this arrangement, it is ensured that in the closed state of the blister pack 1 an electrical connection from the common contact pad 6 exists via a printed conductor 5a' to 5g' running over a pocket 2a to 2g to each of the contact pads 5a to 5g assigned its respective pocket 2a to 2g. In the case of the removal of a pill from a pocket, the electrical connection assigned to the pocket between the common contact pad 6 and the respective contact pads 5a to 5g is interrupted.

To the blister pack 1 thus structured, the aforementioned printed circuit board 8 is assigned, which can be seen from FIGS. 3 and 4. According to the pattern of the contact pads 5a to 5g and 6 of the blister pack 1, the printed circuit board 8 has on one side a pattern of individual contact pads 9a to 9g and a common contact pad 10, where the contact pads 9a to 9g can be aligned to cover the same surface as the contact pads 5a to 5g of the blister pack 1 and the contact pad 10 can be aligned to cover the same surface as the contact pad 6 of the blister pack 1 if the underside of the blister pack 1 is laid onto the surface of the printed circuit board 8 having the contact pads 9a to 9g.

According to the pattern of the contact pads 2a to 2g and the compartment 3 of the blister pack 1, the printed circuit board 8, which preferably consists of a flexible PVC material in particular, has punched perforations 11 corresponding to the pockets 2a to 2g and a punched perforation 16 corresponding to the compartment 3, where said perforations can be aligned to the pockets 2a to 2g or to the compartment 3.

The printed circuit board 8 is preferably dimensioned so that it projects over the blister pack 1 on all sides after its fastening to the blister pack 1, to be explained later.

FIG. 4, seen from above, shows the state in which the printed circuit board 8 is fastened to the blister pack 1, where the contact pads 5a to 5g of the blister pack 1 (cf. FIG. 2) are then electrically connected to the corresponding contact pads 9a to 9g (cf. FIG. 3, 4) of the printed circuit board 8 and the common contact pad 6 of the blister pack 1 is electrically connected to the corresponding contact pad 10 of the printed circuit board 8.

Figure 6:
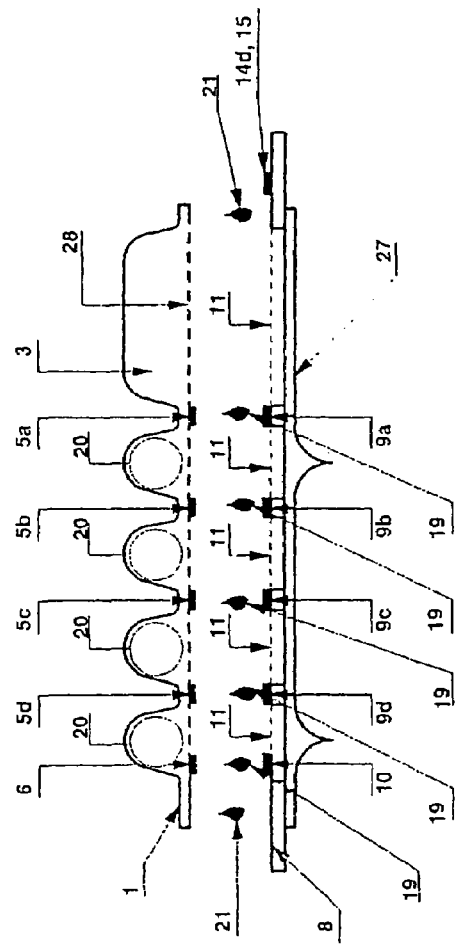
FIG. 6: a section through the present blister pack arrangement in the longitudinal direction, where the printed circuit board and the actual blister pack are still not connected to one another for use.

According to FIG. 6, this is achieved by the fact that the printed circuit board 8 and the blister pack 1 are aligned to one another according to the arrangement of, preferably, conductive adhesive points 19 on the contact pads 5a to 5d and 6 of the foil 28 of the blister pack 1 or on the contact pads 9a to 9g and 10 of the printed circuit board 8 and pressed onto one another. In so doing, electrical connections arise between the contact pads 5a to 5g of the blister pack 1 and the contact pads 9a to 9g of the printed circuit board 8. This state is represented in FIG. 7.

As FIG. 3 shows, individual connection contact pads 14a to 14g are located on one side, preferably an apical side, of the printed circuit board 8 and a common contact pad 15, preferably adjacent to one another in a row. Each individual contact pad 14a to 14g is connected via an individual printed conductor 14 to a certain contact pad 9a and 9g of the printed circuit board 8. The common contact pad 15 is connected via common printed conductor 17 to the common contact pad 10 of the printed circuit board 8. Thus, there are, in the finished blister pack arrangement according to FIGS. 4 and 7, electrical connections between each individual contact pad 14a to 14g, via an individual printed conductor 14, an individual contact pad 9a and 9g of the printed circuit board 8, a conductive adhesive point 19, an individual contact pad 5a and 5g of the blister pack 1, an individual printed conductor 5a' to 5g' of the blister pack 1, the common printed conductor 7 of the blister pack 1, the common contact pad 6 of the blister pack 1, the corresponding conductive adhesive point 19, the corresponding common contact pad 10 of the printed circuit board 8, and the common printed conductor 17 of the same to the common connection contact pad 15.

Figure 7:
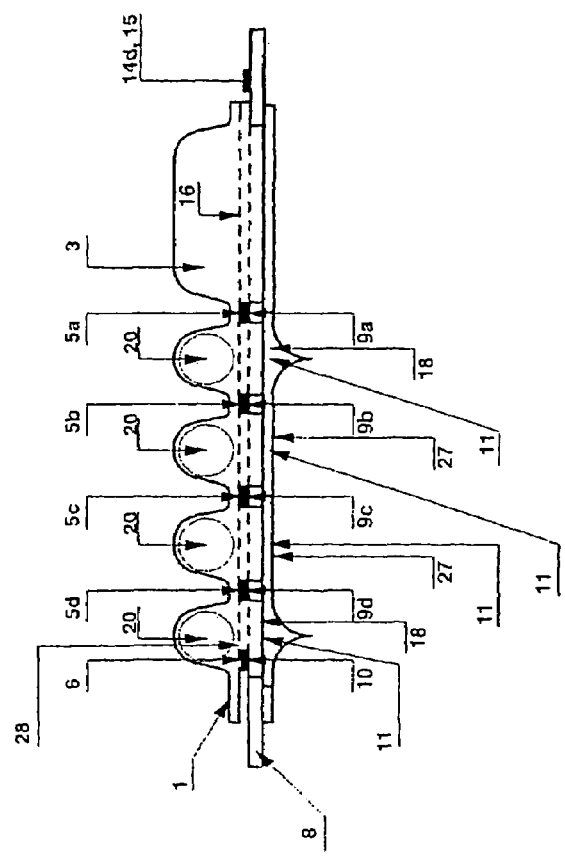
FIG. 7: the blister pack arrangement of FIG. 6, where the blister pack and the printed circuit board are connected to one another for use.
Figure 8A:
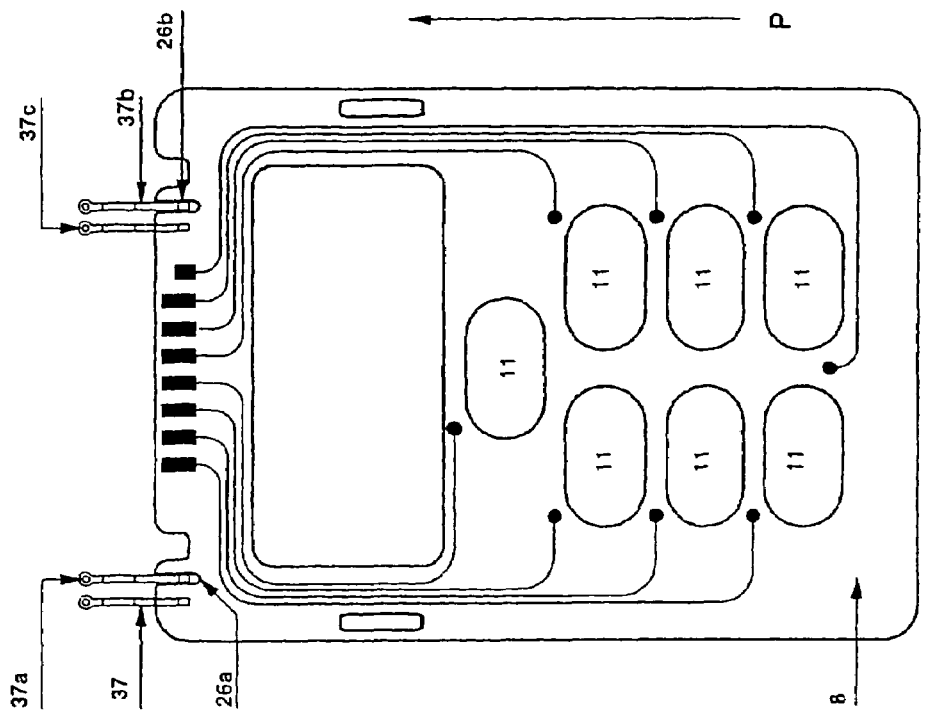
Figure 8:
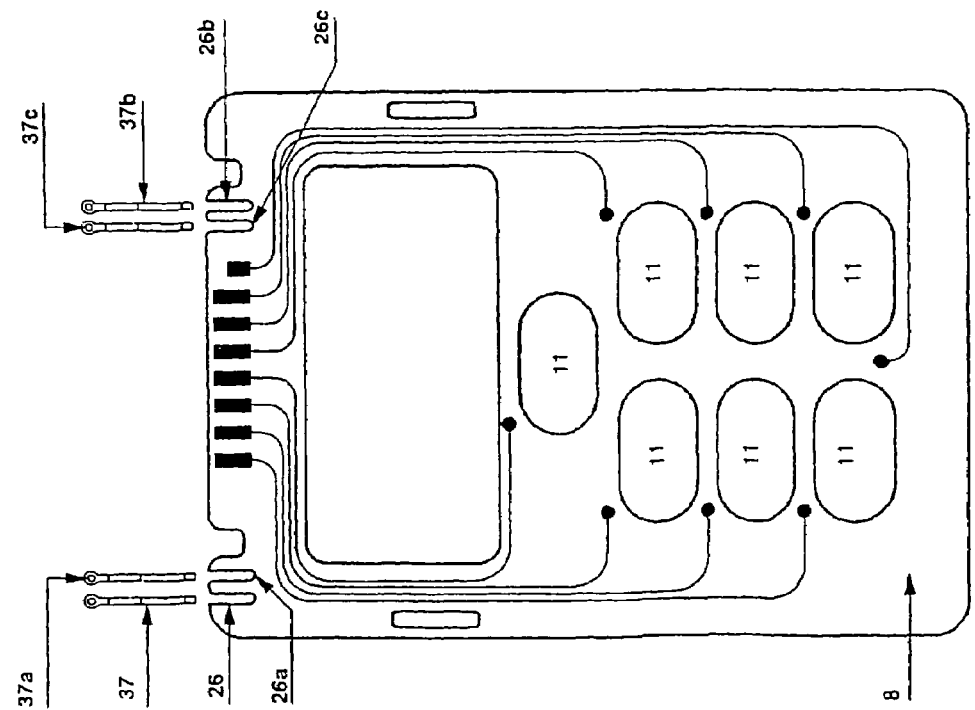

On the removal of a pill 20, e.g., in the removal of the pill 20 disposed on the left in FIG. 7, the foil 28 and the corresponding printed conductor 5d are penetrated so that the corresponding electrical connection for the display of the special pill removal is interrupted. All the other electrical connections continue to exist.

Figure 4B:
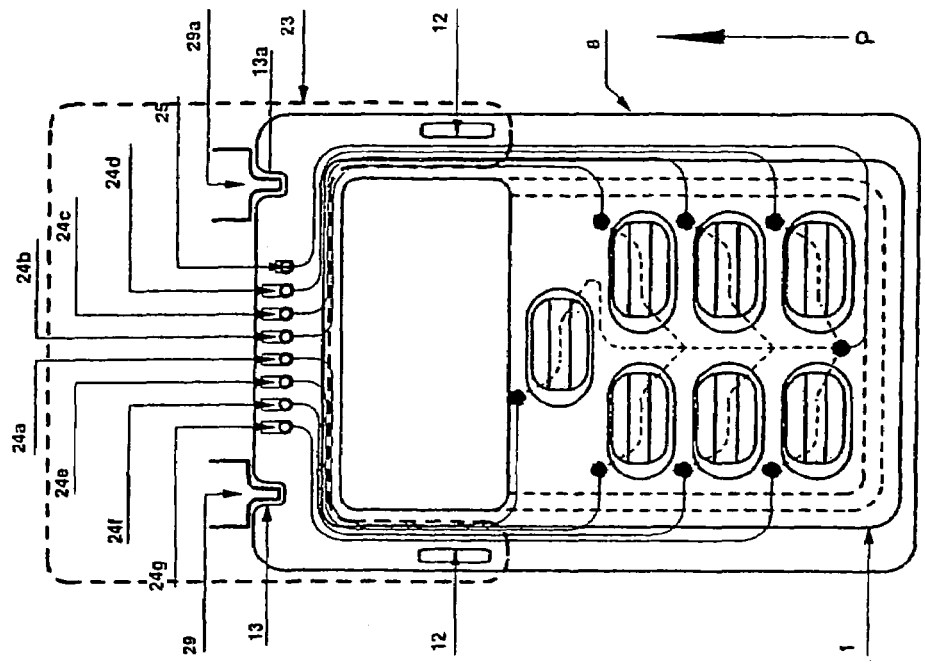
Figure 4A:
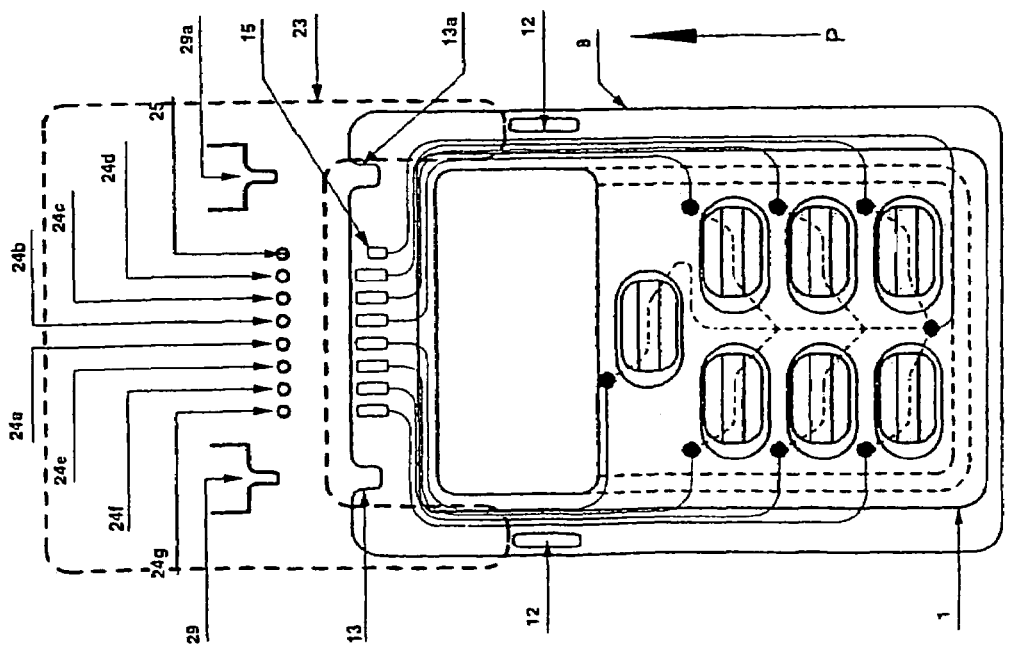

The present blister pack arrangement is according to FIGS. 4a and b, inserted into a schematically represented receiving part 23 of a holding device not represented in more detail, where the electronics unit or an electronics module (not represented) contained in the receiving part 23 (or in the holding device) is connected via the individual connect contacts 24a to 24g to the individual connection contact pads 14a to 14g and 15 (cf. FIG. 4) of the blister pack 1.

In order to prevent, on insertion, a flow of current between the common connection contact pad 25 of the receiving part 23 and an individual contact pad 24a to 24g of the receiving part 23 is first produced, but on further insertion of the blister pack arrangement into the receiving part 23 once again interrupted, which would be indicated by the electronics unit incorrectly as the removal of a pill, the printed circuit board 8 is dimensioned shorter in the insertion direction P of the common contact pad 15 of the printed circuit board 8 than the individual connection contact pads 14a to 14g of the printed circuit board 8 so that any contact between the common contact pad 15 of the printed circuit board 8 and, assigned to it, the contact pad 24a to 24g of the receiving part 23 is only produced when secure contacts have already been produced between the individual connection contact pads 14a to 14g of the printed circuit board 8 and the assigned individual contact pad 24a to 24g of the receiving part 23.

In order to ensure an adjustment and alignment of the blister pack arrangement transverse to the insertion direction P in relation to the receiving part 23, the printed circuit board 8 has on the apical side on each side of its row of connection contact pads 14a to 14g, 15 an alignment groove 13 or 13a, where these alignment grooves 13 and 13a are disposed asymmetrically to the longitudinal center line of the printed circuit board 8 (cf. FIG. 4a, 4b). In the receiving part 23 corresponding projecting parts 29 or 29a (represented schematically) are disposed which engage in the alignment grooves 13 or 13a if the blister pack arrangement is properly disposed in the receiving part 23. Only then can the electrical connections between the connection contact pads 14a to 14g, 15 and 24a to 24g, and 25 be produced.

It is pointed out that in the reverse manner the projecting parts can be disposed on the blister pack arrangement and the alignment grooves can be disposed on the receiving part 23.

Likewise, it is also conceivable to structure the connection contact pad 15 corresponding to the individual connection contact pads 14a to 14g and instead of this to structure the common connection contact pad 25 in the receiving part 23 shorter in the insertion direction P than the individual connection contact pads in the receiving part 23 so that, on insertion of the blister pack arrangement into the receiving part 23, the contact between the common connection contact pad 25 of the receiving part 23 and the connection contact pad 15 of the printed circuit board 8 is produced later than the contacts between the individual contact pads 24a to 24g of the receiving part 23 and the individual connection contact pads 14a to 14g of the printed circuit board 8.

In the following, an additional significant feature of the present invention is explained.

Figure 5:
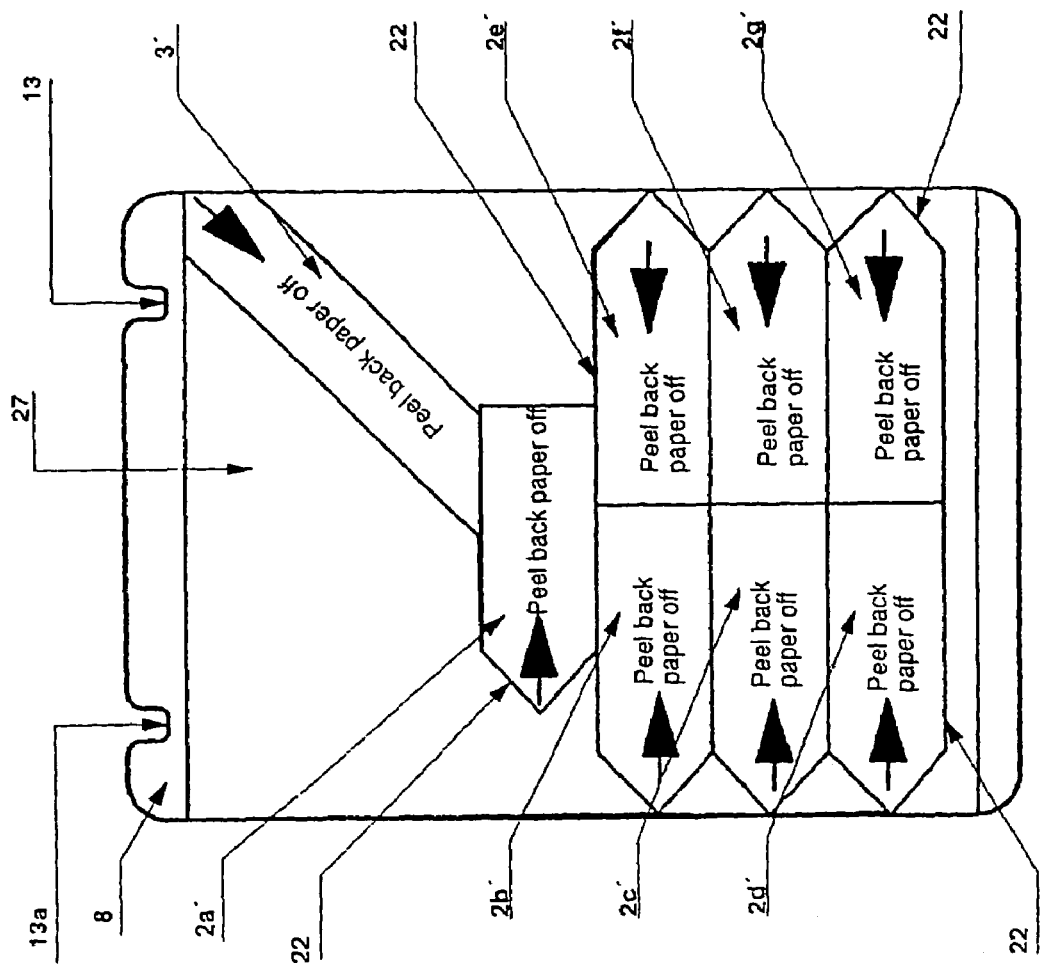
FIG. 5: a printed circuit board partially provided with pull-off strips.

On the underside of the printed circuit board 8, an additional cover layer 27, preferably of material similar to paper, is applied in a manner which can be seen from FIG. 5, said cover layer assigning to every individual pocket 2a to 2g, or to the compartment of the blister pack arrangement 1, having a pull-off area 3' or 2a' to 2g' which covers the edge areas of the corresponding pocket or the compartment. On use of the blister pack arrangement 1, the corresponding area must be pulled off before the pressing out of a pill or before the opening of the compartment 3.

The pull-off areas 2a' to 2g' and 3' are connected by an adhesive connection to the underside of the printed circuit board 8, where it is possible to undo said adhesive connection by the application of force, and are connected via a stamped-in line 22 to the cover layer 27.

Thereby it is achieved that small children (as a rule up to the age of 42 months) will not take pills from out of a pharmaceutical container in the course of their own play because they are, as a rule, not in the position to grasp two different facts, namely the pulling off of the pull-off strip and the pressing out of a pill.

According to FIG. 4, 4a,b, it is conceivable to provide slots 12 running in the insertion direction in the longitudinal edges of the printed circuit board 8 which project over the blister pack (1), said slots engaging in the corresponding projections (not represented) of the receiving part 23 or the holding device when the blister pack arrangement reaches the correct position in the receiving part 23. In this way a hold, secured against unintentional pulling out, of the blister pack arrangement in the receiving part 23 is ensured.

In order to make possible a display of the current contents of the blister pack 1, the blister pack 1 can have the coding already mentioned which can be recorded by the electronics unit. A preferred form of embodiment follows from FIGS. 8, 8a, 9, 9a, and 9b.

In the blister pack 1 coding, grooves 26, 26a-c are disposed in the apical side to be inserted into the receiving part 23, said coding grooves working together with the contact springs 37, 37a to c which are disposed in the receiving part 23 expediently in the insertion direction P. FIG. 9 (top) shows such a contact spring 37 seen from above while FIG. 9 (bottom) shows the contact spring 37 from the side. In the receiving part 23 the contact springs 37 according to FIGS. 9a and 9b are fastened to an upper printed circuit board 30 so that their contact areas abut, in the manner of a spring, a contact pad 32 of a lower printed circuit board 31 opposite the upper printed circuit board 30.

According to whether or not the contact springs 37, 37a-c on insertion of the blister pack arrangement in the insertion direction P strike a coding groove 26, 26a-c, the contact between contact spring and contact pad is interrupted or not. In this way, different statements on the content or the type of the blister pack 1 can be made in the case of, for example, four contact springs according to a predetermined assignment of coding grooves, or no coding grooves, 16 and recorded or displayed by the electronics unit.

Figure 10B:
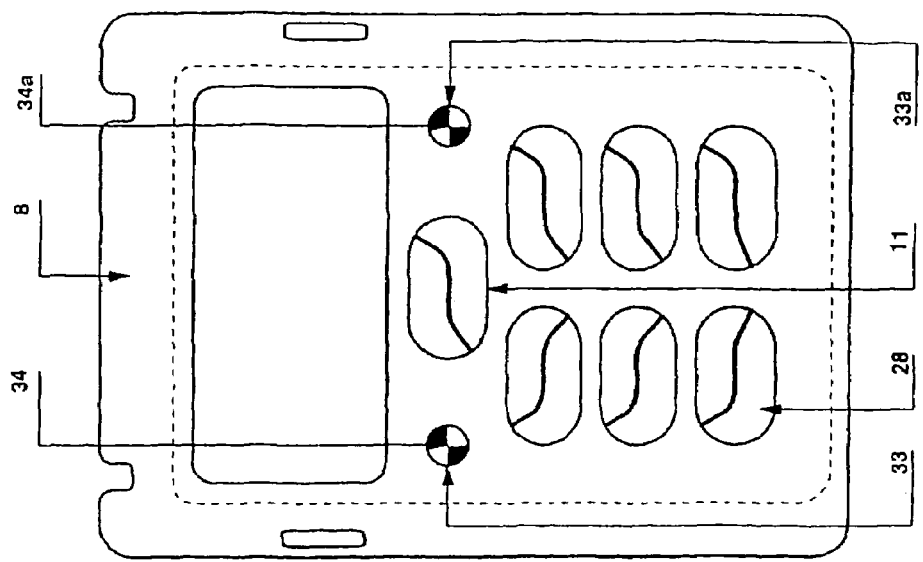
Figure 10A:
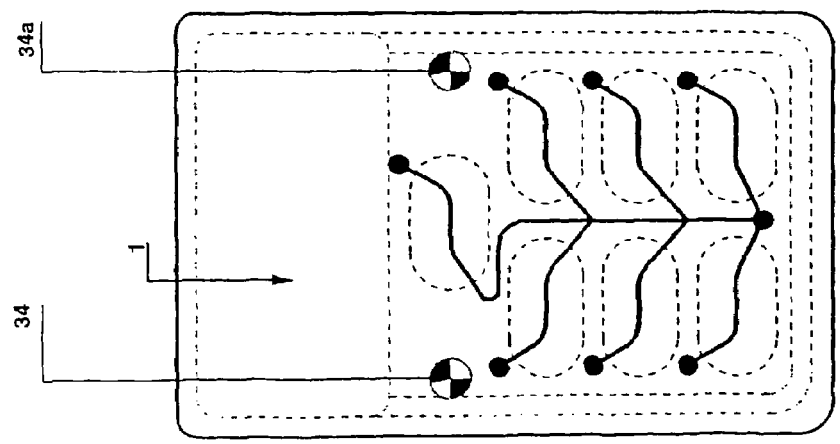
Figure 10:
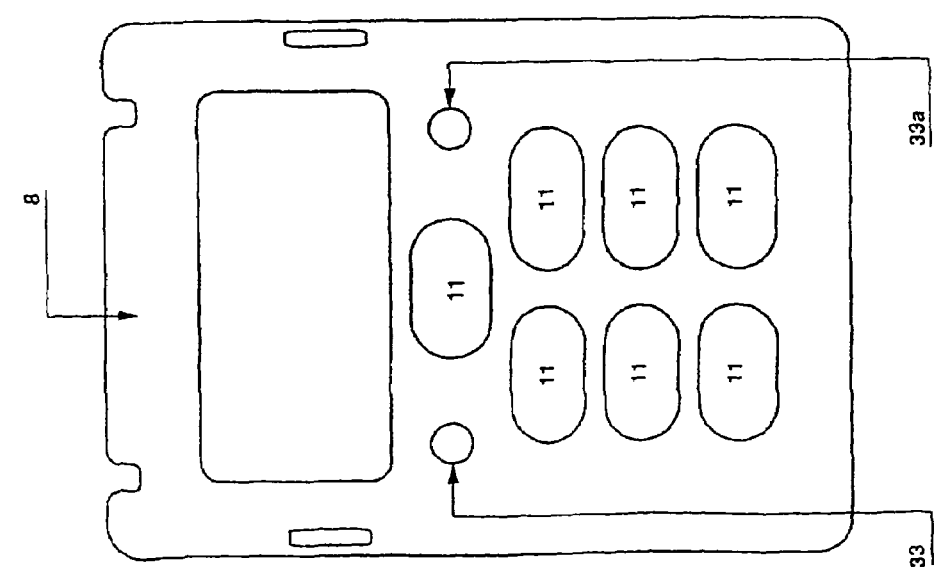

In connection with FIGS. 10, 10a, and 10b, a preferred process for the mounting of the printed circuit board 8 on the foil 28 of the blister pack 1 is explained. The printed circuit board 8 has for these windows 33, 33a, which are aligned in the correct fixation position to passer marks 34, 34a, which are applied to the foil 28 of the blister pack 1. After, for example, the contact pads 5a-g and 6 of the blister pack 1 are provided with conductive, adhesive points 19, the individual blister packs 1 disposed in sequence in the manner of a track are traversed in their longitudinal direction, where printed circuit boards 8, also disposed in sequence in the manner of a track, are brought close from above and finally traversed parallel to the blister packs 1 until a, preferably optical, sensing mechanism recognizes that the windows 33, 33a of a printed circuit boards 8 are aligned to the passer marks 34, 34a of a blister pack 1. As soon as this is the case, the printed circuit boards 8 is pressed against the blister pack 1 and connected to the foil 28 of the same, in particular glued.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

What is claimed is:

1. A blister pack system comprising:
    a blister pack that is insertable into a receiving part of a holding device, the blister pack having pockets sealed by a foil with individual contact pads disposed on an outer side of the foil and assigned to one of the pockets, and an individual printed conductor that runs from each of the individual contact pads on the outer side of the foil over the corresponding pocket to a common printed conductor connected to a common contact pad on the outer side of the foil, such that during removal of a pill from the pocket the individual printed conductor assigned to this pocket is interrupted; and
    a printed circuit board having stamped perforations corresponding to a pattern of the pockets of the blister pack, and individual contact pads and a common contact pad corresponding to a pattern of the individual contact pads and the common contact pad of the blister pack, each of the contact pads of the printed circuit board being aligned with a respective one of the contact pads of the blister pack, the common contact pad of the printed circuit board being aligned with the common contact pad of the blister pack, and the stamped perforations of the printed circuit board being aligned with the pockets of the blister pack, such that (i) the corresponding contact pads of the printed circuit board and the contact pads of the blister pack and (ii) the common contact pad of the printed circuit board and the common contact pad of the blister pack are electrically connected to one another, the printed circuit board having in an edge area thereof individual contact pads each connected via an individual printed conductor to an individual contact pad of the printed circuit board, and a common connection contact pad connected via a common printed conductor to the common contact pad of the printed circuit board,
    a connection between the individual contact pads of the printed circuit board and the corresponding individual contact pads of the blister pack, and a connection between the common contact pad of the printed circuit board and the common contact pad of the blister pack being produced via conductive adhesive points.

2. The blister pack system according to claim 1, wherein the printed circuit board constructed of at least one of plastic and cardboard.

3. The blister pack system according to claim 1, wherein the printed circuit board is flexible.

4. The blister pack system according to claim 1, wherein the blister pack has individual connection contact pads and a common connection contact pad which cooperate, respectively, with corresponding individual connection contact pads and a common connection contact pad of the receiving part of the holding device when the blister pack arrangement is inserted into the receiving part.

5. The blister pack system according to claim 4, wherein the individual connection contact pads and the common connection contact pad are disposed on an apical side of the printed circuit board in a row transverse to an insertion direction (P).

6. The blister pack system according to claim 5, wherein relative to the insertion direction (P), the common connection contact pad is dimensioned shorter than the individual connection contact pads of the printed circuit board.

7. The blister pack system according to claim 5, wherein relative to the insertion direction (P), the individual connection contact pads and the common connection contact pad of the printed circuit board have an equal length and the common connection contact pad of the receiving part is dimensioned shorter than the individual connection contact pads of the receiving part.

8. The blister pack system according to claim 1, wherein, on an apical side asymmetrically to a longitudinal center line of the blister pack system in an insertion direction (P), at least two alignment grooves are disposed in which projecting parts of the receiving part engage as the blister pack system is inserted into the receiving part.

9. The blister pack system according to claim 1, wherein, on an apical side line of the blister pack system, projecting parts are disposed asymmetrically to a longitudinal center line of the blister pack system in an insertion direction (P) which engage in corresponding engagement grooves of the receiving part as the blister pack system is inserted into the receiving part.

10. The blister pack system according to claim 1, wherein the blister pack has in the edge area a bead running over at least three sides thereof for reinforcement.

11. The blister pack system according to claim 1, further comprising in the edge area on sides opposite in an insertion direction (P), at least one of slots and projections, into which corresponding at least one of projections and slots of the receiving part engage as the blister pack system is fully inserted into the receiving part.

12. The blister pack system according to claim 1, wherein the printed circuit board and the receiving part have coding devices for display by an electronic unit of information relating to the blister pack.

13. The blister pack system according to claim 1, wherein piercing windows are disposed in the printed circuit board and, for fastening the printed circuit board to the foil of the blister pack the piercing windows are alignable to passer marks disposed on the foil.

14. The blister pack system according to claim 1, wherein the blister pack is connected to the printed circuit board in the edge area by an adhesive.

15. The blister pack system according to claim 2, wherein the plastic is a PVC.

16. A blister pack system comprising:
    a blister pack that is insertable into a receiving part of a holding device, the blister pack having pockets sealed by a foil with individual contact pads disposed on an outer side of the foil and assigned to one of the pockets, and an individual printed conductor that runs from each of the individual contact pads on the outer side of the foil over the corresponding pocket to a common printed conductor connected to a common contact pad on the outer side of the foil, such that during removal of a pill from the pocket the individual printed conductor assigned to this pocket is interrupted; and
    a printed circuit board having stamped perforations corresponding to a pattern of the pockets of the blister pack, and individual contact pads and a common contact pad corresponding to a pattern of the individual contact pads and the common contact pad of the blister pack, each of the contact pads of the printed circuit board being aligned with a respective one of the contact pads of the blister pack, the common contact pad of the printed circuit board being aligned with the common contact pad of the blister pack, and the stamped perforations of the printed circuit board being aligned with the pockets of the blister pack, such that (i) the corresponding contact pads of the printed circuit board and the contact pads of the blister pack and (ii) the common contact pad of the printed circuit board and the common contact pad of the blister pack are electrically connected to one another, the printed circuit board having in an edge area thereof individual contact pads each connected via an individual printed conductor to an individual contact pad of the printed circuit board, and a common connection contact pad connected via a common printed conductor to the common contact pad of the printed circuit board, a printed conductor-free side of the printed circuit board having fastened thereon a cover layer with pull-off areas the pull-off areas being removable from the cover layer for the release of the stamped perforations of the printed circuit board which are aligned to the pockets of the blister pack.

17. The blister pack system according to claim 16, wherein the pull-off areas of the cover layer are connected via stamped-in lines to the cover layer.

18. The blister pack system according to claim 16, wherein the blister pack has a compartment for receiving a pack insert slip and the printed circuit board has an additional stamped perforation aligned to the compartment.

19. The blister pack system according to claim 18, wherein the cover layer has an additional pull-off area assigned to the additional stamped perforation from which the cover layer is separable.

20. A blister pack system comprising:
a blister pack that is insertable into a receiving part of a holding device, the blister pack having pockets sealed by a foil with individual contact pads disposed on an outer side of the foil and assigned to one of the pockets, and an individual printed conductor that runs from each of the individual contact pads on the outer side of the foil over the corresponding pocket to a common printed conductor connected to a common contact pad on the outer side of the foil, such that during removal of a pill from the pocket the individual printed conductor assigned to this pocket is interrupted; and a printed circuit board having stamped perforations corresponding to a pattern of the pockets of the blister pack, and individual contact pads and a common contact pad corresponding to a pattern of the individual contact pads and the common contact pad of the blister pack, each of the contact pads of the printed circuit board being aligned with a respective one of the contact pads of the blister pack, the common contact pad of the printed circuit board being aligned with the common contact pad of the blister pack, and the stamped perforations of the printed circuit board being aligned with the pockets of the blister pack, such that (i) the corresponding contact pads of the printed circuit board and the contact pads of the blister pack and (ii) the common contact pad of the printed circuit board and the common contact pad of the blister pack are electrically connected to one another, the printed circuit board having in an edge area thereof individual contact pads each connected via an individual printed conductor to an individual contact pad of the printed circuit board, and a common connection contact pad connected via a common printed conductor to the common contact pad of the printed circuit board, the printed circuit board and the receiving part having a coding device for display by an electronics unit of information relating to the blister pack, the coding device including contact springs disposed in the receiving part and coding grooves selectively disposed on the printed circuit board the contact springs being separated by the inserted printed circuit board from the assigned contact pads when the contact springs do not encounter the coding grooves, and being connected to the contact pads if the contact springs do encounter the coding grooves.

\* \* \* \* \*